United States Patent
Furuta

(10) Patent No.: US 10,230,385 B2
(45) Date of Patent: Mar. 12, 2019

(54) ANALOG/DIGITAL CONVERSION DEVICE AND CONTROL METHOD THEREFOR

(71) Applicant: FUJIFILM Corporation, Tokyo (JP)

(72) Inventor: Yoshinori Furuta, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/104,817

(22) Filed: Aug. 17, 2018

(65) Prior Publication Data

US 2018/0358974 A1 Dec. 13, 2018

Related U.S. Application Data

(63) Continuation of application No. PCT/JP2016/084956, filed on Nov. 25, 2016.

(30) Foreign Application Priority Data

Mar. 25, 2016 (JP) .................................. 2016-061882

(51) Int. Cl.
- *H03M 1/10* (2006.01)
- *H03M 1/06* (2006.01)
- *H04N 5/202* (2006.01)

(52) U.S. Cl.
CPC .......... *H03M 1/0604* (2013.01); *H04N 5/202* (2013.01)

(58) Field of Classification Search
CPC .............................. H03M 1/0604; H04N 5/202
(Continued)

(56) References Cited

U.S. PATENT DOCUMENTS

| 4,064,484 A | * | 12/1977 | Mese | ...................... G06K 9/38 |
| | | | | 341/165 |
| 6,667,705 B2 | * | 12/2003 | Parfitt | .................. G05B 19/054 |
| | | | | 341/120 |

(Continued)

FOREIGN PATENT DOCUMENTS

| JP | 2-105629 A | 4/1990 |
| JP | 4-326625 A | 11/1992 |

(Continued)

OTHER PUBLICATIONS

International Preliminary Report on Patentability dated Feb. 14, 2017, issued in PCT/JP2016/084956 (Form PCT/IPEA/409) and English translation.

(Continued)

*Primary Examiner* — Brian K Young
(74) *Attorney, Agent, or Firm* — Birch, Stewart, Kolasch & Birch, LLP

(57) ABSTRACT

An analog/digital conversion device that performs analog/digital conversion on an analog signal having different levels using different analog/digital conversion circuits, and a control method therefor are provided. In a case where an analog signal is greater than a threshold value, an output terminal of a first changeover switch is turned on. The analog signal is converted into digital data in a single slope type analog/digital conversion circuit. In a case where the analog signal is smaller than the threshold value, an output terminal of the first changeover switch is turned on. The analog signal is converted into digital data in a hybrid type analog/digital conversion circuit of which precision of conversion of the analog signal greater than the threshold value into digital data is lower than the precision of a single slope type analog/digital conversion circuit.

9 Claims, 8 Drawing Sheets

(58) Field of Classification Search
USPC .................................................. 341/155, 120
See application file for complete search history.

(56) References Cited

U.S. PATENT DOCUMENTS

| | | |
|---|---|---|
| 7,589,766 B2 * | 9/2009 | Itani ..................... H04N 5/2352 |
| | | 348/229.1 |
| 9,680,492 B1 * | 6/2017 | Farley ................. H03M 1/0863 |
| 2008/0055130 A1 | 3/2008 | Sayers |
| 2014/0211058 A1 | 7/2014 | Nishihara et al. |
| 2015/0244388 A1 | 8/2015 | Hashimoto et al. |

FOREIGN PATENT DOCUMENTS

| | | | |
|---|---|---|---|
| JP | 2008-517513 | A | 5/2008 |
| JP | 2012-23466 | A | 2/2012 |
| JP | 2013-90139 | A | 5/2013 |
| JP | 2015-162751 | A | 9/2015 |
| JP | 2016-189515 | A | 11/2016 |

OTHER PUBLICATIONS

International Search Report dated Feb. 14, 2017, issued in PCT/JP2016/084956 (Form PCT/ISA/210).

\* cited by examiner

HIGH ILLUMINANCE EMPHASIZED IMAGE

LOW ILLUMINANCE EMPHASIZED IMAGE

ANALOG/DIGITAL CONVERSION DEVICE AND CONTROL METHOD THEREFOR

CROSS-REFERENCE TO RELATED APPLICATIONS

This application is a Continuation of PCT International Application No. PCT/JP2016/084956 filed on Nov. 25, 2016, which claims priority under 35 U.S.C. § 119(a) to Japanese Patent Application No. 2016-061882 filed on Mar. 25, 2016. Each of the above application(s) is hereby expressly incorporated by reference, in its entirety, into the present application.

BACKGROUND OF THE INVENTION

1. Field of the Invention

The present invention relates to an analog/digital conversion device and a control method therefor.

2. Description of the Related Art

There is a method of performing imaging so that a video signal obtained by the imaging becomes small since a subject with a certain brightness or higher may be imaged with pure white in a case where the subject is imaged. Further, in a case where imaging is performed so that a video signal becomes small, a gradation becomes worse, and a low illuminance portion of the subject image may collapse. In a case where the gradation is improved, the amount of data is increased. Accordingly, in a case where analog/digital conversion is performed, a time taken for the analog/digital conversion increases.

Further, an AD conversion device that operates in a 1-bit output mode at the time of low illuminance imaging and operates in a multi-bit resolution output mode at the time of high illuminance imaging (JP2013-90139A), an AD converter that is switched between a normal operation and a high speed operation (JP2012-23466A), an AD converter using an AD conversion scheme in which a successive approximation scheme and a lamp comparison scheme are combined (JP2015-162751A), and the like are also considered.

SUMMARY OF THE INVENTION

However, in any of JP2013-90139A, JP2012-23466A, and JP2015-162751A, analog/digital conversion is not performed while focusing on a level of an analog signal. Therefore, even in a case where high-precision analog/digital conversion is not required for an analog signal at a low level, the analog/digital conversion is performed by an analog/digital conversion circuit with precision that is the same as that of an analog signal at a high level.

An object of the present invention is to perform analog/digital conversion on an analog signal having different levels using analog/digital conversion circuits with different precision.

An analog/digital conversion device according to the present invention comprises a first analog/digital conversion circuit that converts an input analog signal into digital data; a second analog/digital conversion circuit of which precision of conversion of an analog signal greater than a threshold value into digital data is lower than precision of the first analog/digital conversion circuit; and a first switching device (first switching means) that gives the analog signal to the first analog/digital conversion circuit in a case where the analog signal to be converted into the digital data is greater than the threshold value, and gives the analog signal to the second analog/digital conversion circuit in a case where the analog signal to be converted into the digital data is smaller than the threshold value.

The present invention also provides a method for controlling an analog/digital conversion device. That is, this method comprises: converting an input analog signal into digital data by a first analog/digital conversion circuit; converting the input analog signal into the digital data by a second analog/digital conversion circuit of which precision of conversion of an analog signal greater than a threshold value into digital data is lower than precision of the first analog/digital conversion circuit; and giving, by switching device, the analog signal to the first analog/digital conversion circuit in a case where the analog signal to be converted into the digital data is greater than the threshold value, and giving the analog signal to the second analog/digital conversion circuit in a case where the analog signal to be converted into the digital data is smaller than the threshold value.

For example, a time of conversion into the digital data in the first analog/digital conversion circuit is longer than a time of conversion into the digital data in the second analog/digital conversion circuit.

The second analog/digital conversion circuit includes a third analog/digital conversion circuit that converts an input analog signal into digital data, a fourth analog/digital conversion circuit of which precision of the conversion into digital data is higher than precision of the conversion into digital data in the third analog/digital conversion circuit, and a second switching device (second switching means) that switches between the third analog/digital conversion circuit and the fourth analog/digital conversion circuit to give the input analog signal to the third analog/digital conversion circuit and then give the input analog signal to the fourth analog/digital conversion circuit.

The analog/digital conversion device may further comprise a gamma correction circuit that gamma-corrects the digital data converted by the first analog/digital conversion circuit or the second analog/digital conversion circuit according to the set gamma correction curve.

For example, the first switching device gives the analog signal to the first analog/digital conversion circuit in a case where the gamma correction curve set in the gamma correction circuit puts emphasis on high illuminance, and gives the analog signal to the second analog/digital conversion circuit in a case where the gamma correction curve set in the gamma correction circuit puts emphasis on low illuminance.

For example, in the second switching device, a timing of switching from the third analog/digital conversion circuit to the fourth analog/digital conversion circuit is earlier as the gamma correction curve is a gamma correction curve putting emphasis on high illuminance rather than a gamma correction curve putting emphasis on low illuminance.

The first analog/digital conversion circuit and the fourth analog/digital conversion circuit may be the same type of analog/digital conversion circuits.

The first analog/digital conversion circuit and the fourth analog/digital conversion circuit may be, for example, a single slope analog/digital conversion circuit or may be a double integration type analog/digital conversion circuit.

Further, the third analog/digital conversion circuit is, for example, a successive approximation type analog/digital conversion circuit.

Furthermore, the fourth analog/digital conversion circuit is, for example, a single slope analog/digital conversion circuit.

According to the present invention, the first analog/digital conversion circuit and the second analog/digital conversion circuit are included. In the second analog/digital conversion circuit, in a case where the analog signal is greater than the threshold value, the precision of conversion into the digital data is lower than the precision of the first analog/digital conversion circuit. In a case where the analog signal is greater than the threshold value, the analog signal is given to the first analog/digital conversion circuit with high precision, and in a case where the analog signal is smaller than the threshold value, the analog signal is given to the second analog/digital conversion circuit with low precision. The two analog/digital conversion circuits can be effectively used. Generally, a conversion time in the second analog/digital conversion circuit is shorter than the conversion time in the first analog/digital conversion circuit. A time taken for the analog/digital conversion can be shortened as compared with a case where the analog/digital conversion is performed in the first analog/digital conversion circuit irrespective of a level of the analog signal. In addition, since the analog/digital conversion is performed on the analog signal at a level higher than the threshold value using the first analog/digital conversion circuit of which the precision is higher than the precision of the second analog/digital conversion circuit, precision of a portion represented by the analog signal at a high level can be maintained to be high.

DESCRIPTION OF THE PREFERRED EMBODIMENTS

Figure 1:
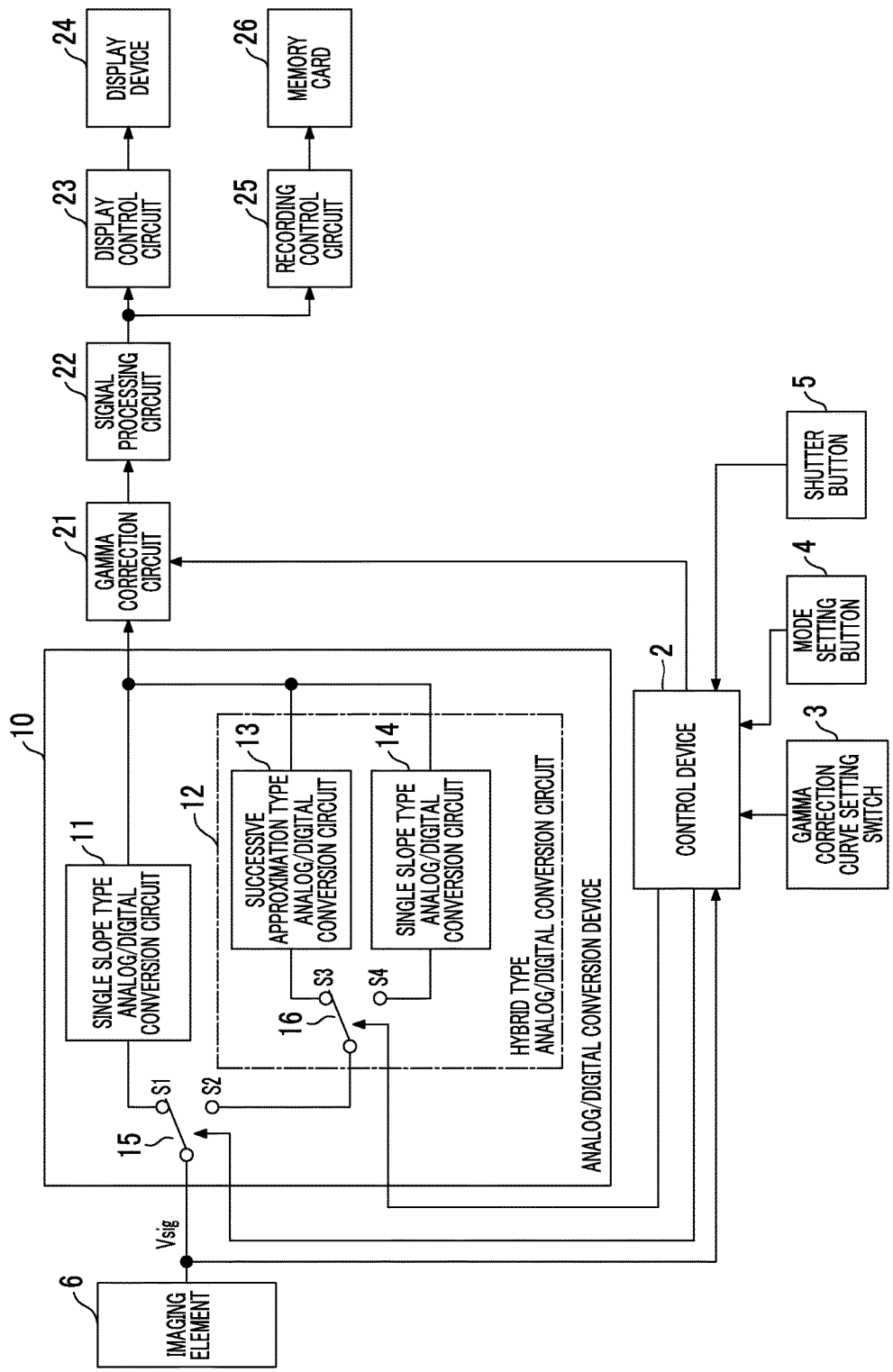
FIG. 1 is a block diagram illustrating an electric configuration of a digital camera.

FIG. 1 is a diagram illustrating an embodiment of the present invention, which is a block diagram illustrating the electric configuration of a digital camera 1.

An overall operation of the digital camera 1 is controlled by the control device 2.

The digital camera 1 includes various switches such as a gamma correction curve setting switch 3, a mode setting button 4, and a shutter button 5. The digital camera 1 includes a gamma correction circuit 21 capable of setting various gamma correction curves. The gamma correction curve setting switch 3 is used in a case where a user sets a desired gamma correction curve among the gamma correction curves that can be set by the gamma correction circuit 21. The mode setting button 4 is manipulated by the user in a case where the user sets a desired imaging mode among various imaging modes. Output signals from the gamma correction curve setting switch 3, the mode setting button 4, and the shutter button 5 are input to the control device 2.

In a case where a subject is imaged by the imaging element 6, an analog signal Vsig representing the subject image is output from the imaging element 6. The analog signal Vsig output from the imaging element 6 is input to an analog/digital conversion device 10 and converted into digital data. The analog/digital conversion process in the analog/digital conversion device 10 will be described in detail below. The analog signal Vsig output from the imaging element 6 is also input to the control device 2.

The digital data output from the analog/digital conversion device 10 is input to the gamma correction circuit 21. The digital data is gamma-corrected according to the gamma correction curve set in the gamma correction circuit 21. The digital data output from the gamma correction circuit 21 is input to the signal processing circuit 22, and predetermined signal processing is performed.

The digital data output from the signal processing circuit 22 is input to the display control circuit 23. The display device 24 is controlled by the display control circuit 23, and the captured subject image is displayed on a display screen of the display device 24.

In a case where the shutter button 5 is pressed, the digital data output from the signal processing circuit 22 as described above is input to the recording control circuit 25. The digital data representing the subject image is recorded on a memory card 26 by the recording control circuit 25.

The analog/digital conversion device 10 includes a single slope type analog/digital conversion circuit 11 (a first analog/digital conversion circuit) and a hybrid type analog/digital conversion circuit 12 (a second analog/digital conversion circuit). A time of conversion into digital data in the single slope type analog/digital conversion circuit 11 is longer than the time of conversion into digital data in the hybrid type analog/digital conversion circuit 12.

The analog/digital conversion device 10 includes a first changeover switch 15. The analog signal Vsig output from the imaging element 6 is given to an input terminal of the first changeover switch 15. A single slope type analog/digital conversion circuit 11 is connected to one output terminal S1 of the first changeover switch 15. The hybrid type analog/digital conversion circuit 12 is connected to the other output terminal S2 of the first changeover switch 15. In a case where the output terminal S1 of the first changeover switch 15 is turned on, the analog signal Vsig input to the analog/digital conversion device 10 is input to the single slope type analog/digital conversion circuit 11, and analog/digital conversion is performed by the single slope type analog/digital conversion circuit 11. In a case where the output terminal S2 of the first changeover switch 15 is turned on, the analog signal Vsig input to the analog/digital conversion device 10 is input to the hybrid type analog/digital conversion circuit 12, and analog/digital conversion is performed by the hybrid type analog/digital conversion circuit 12. An output of the single slope type analog/digital conversion circuit 11 or the hybrid type analog/digital conversion circuit 12 becomes an output of the analog/digital conversion device 10 and is input to the gamma correction circuit 21 as described above.

The hybrid type analog/digital conversion circuit 12 includes a successive approximation type analog/digital conversion circuit 13 (a third analog/digital conversion circuit) and a single slope type analog/digital conversion circuit 14 (a fourth analog/digital conversion circuit).

The hybrid type analog/digital conversion circuit 12 includes a second changeover switch 16. The output terminal S2 of the first changeover switch 15 is connected to an input terminal of the second changeover switch 16. In a case where the output terminal S2 of the first changeover switch 15 is turned on, the analog signal Vsig passing through the first changeover switch 15 is given to the input terminal of the second changeover switch 16. The successive approximation type analog/digital conversion circuit 13 is connected to one output terminal S1 of the second changeover switch 16. The single slope type analog/digital conversion circuit 14 is connected to the other output terminal S2 of the second changeover switch 16. In a case where the output terminal S1 of the second changeover switch 16 is turned on, the analog signal Vsig input to the hybrid type analog/digital conversion circuit 12 is input to the successive approximation type analog/digital conversion circuit 13, and analog/digital conversion is performed by the successive approximation type analog/digital conversion circuit 13. In a case where the output terminal S2 of the second changeover switch 16 is turned on, the analog signal Vsig input to the hybrid type analog/digital conversion circuit 12 is input to the single slope type analog/digital conversion circuit 14, and the single slope type analog/digital conversion is performed by the analog/digital conversion circuit 14. The output of the successive approximation type analog/digital conversion circuit 13 or the single slope type analog/digital conversion circuit 14 is an output of the hybrid type analog/digital conversion circuit 12.

Figure 2:
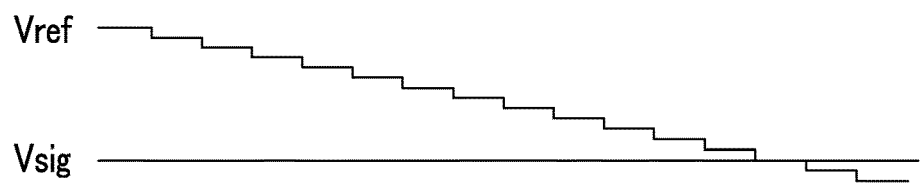
FIG. 2 illustrates a state of analog/digital conversion of a single slope type analog/digital conversion circuit.

FIG. 2 illustrates a state of the analog/digital conversion in the single slope type analog/digital conversion circuit 11 (the same applies to the single slope type analog/digital conversion circuit 14).

In the analog/digital conversion of the single slope type analog/digital conversion circuit 11, counting is performed by a counter (not illustrated) until a gradually decreasing (or increasing) reference signal Vref matches the analog signal Vsig. A count value obtained by the counter corresponds to the digital data of the analog signal Vsig.

In the analog/digital conversion of the single slope type analog/digital conversion circuit 11 (single slope type analog/digital conversion circuit 14), conversion into the digital data takes time, but there are characteristics in which precision of conversion of the analog signal into the digital data is high.

Figure 3:
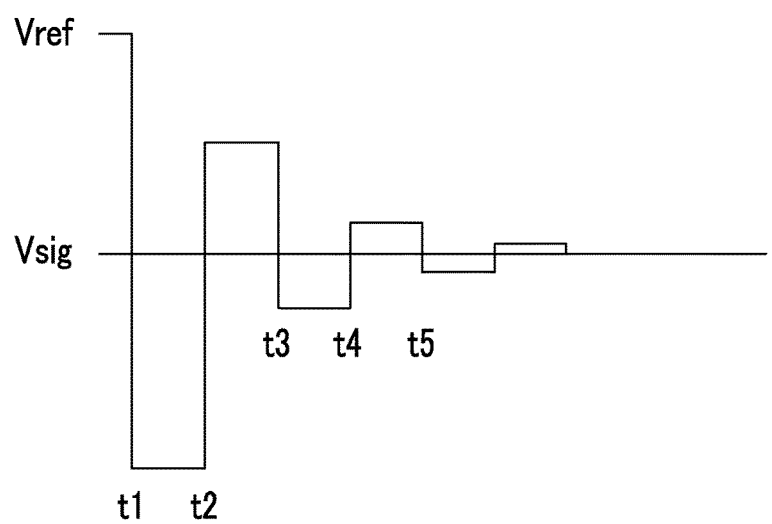
FIG. 3 illustrates a state of analog/digital conversion of a successive approximation type analog/digital conversion circuit.

FIG. 3 illustrates a state of analog/digital conversion in the successive approximation type analog/digital conversion circuit 13.

In the analog/digital conversion of the successive approximation type analog/digital conversion circuit 13, a reference signal Vref is used, and analog/digital conversion is performed sequentially from the most significant bit of the digital data. In a case where digital data after the conversion is 12 bits, the analog/digital conversion is performed in order from the 12th bit. For example, digital data of the 12th bit is obtained between time t1 and time t2, digital data of the 11th bit is obtained between time t2 and time t3, digital data of the 10th bit is obtained between time t3 and time t4, and digital data of the 9th bit is obtained from time t4 to time t5. The same applies to other digital data.

In the analog/digital conversion of the successive approximation type analog/digital conversion circuit 13, precision of conversion of an analog signal into digital data is low, but there are characteristics that the conversion into the digital data does not relatively take time. In the successive approximation type analog/digital conversion circuit 13, in particular, the precision of conversion of an analog signal smaller than the threshold value into the digital data is low. As illustrated in FIG. 1, in a case where the analog/digital conversion is performed on the analog signal Vsig output from the imaging element 6, precision of the analog/digital conversion is lower in the analog signal Vsig representing an image with lower illuminance.

Figure 4:
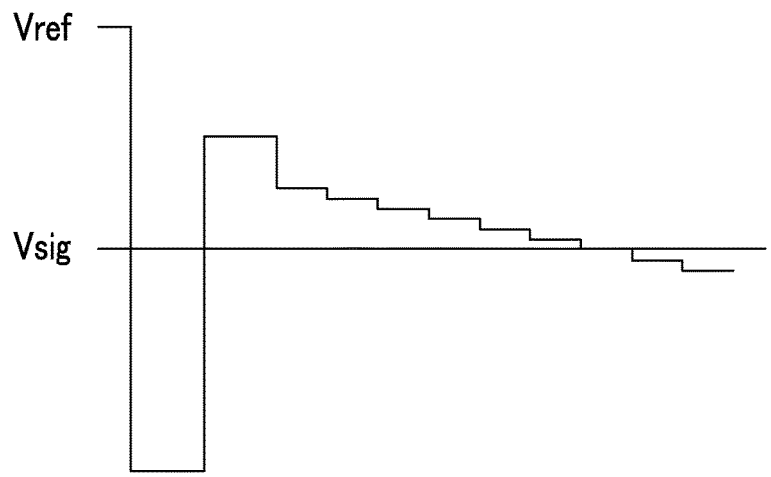
FIG. 4 illustrates a state of analog/digital conversion of a hybrid type analog/digital conversion circuit.

FIG. 4 illustrates a state of analog/digital conversion in the hybrid type analog/digital conversion circuit 12.

In the analog/digital conversion of the hybrid type analog/digital conversion circuit 12, the successive approximation type analog/digital conversion circuit 13 is used for the conversion of the digital data of high-order bits, and the single slope type analog/digital conversion circuit 14 is used for the conversion of the digital data other than the high-order bits. By the analog/digital conversion being performed using the hybrid type analog/digital conversion circuit 12, digital data can be obtained rapidly for the high-order bits. Since the analog/digital conversion is performed on the digital data other than the high-order bits using the single slope type analog/digital conversion circuit 14, digital data with high precision can be obtained. This means that the digital data with high precision can be obtained for an analog signal smaller than the threshold value, such as the analog signal Vsig representing an image with low illuminance.

Figure 5:
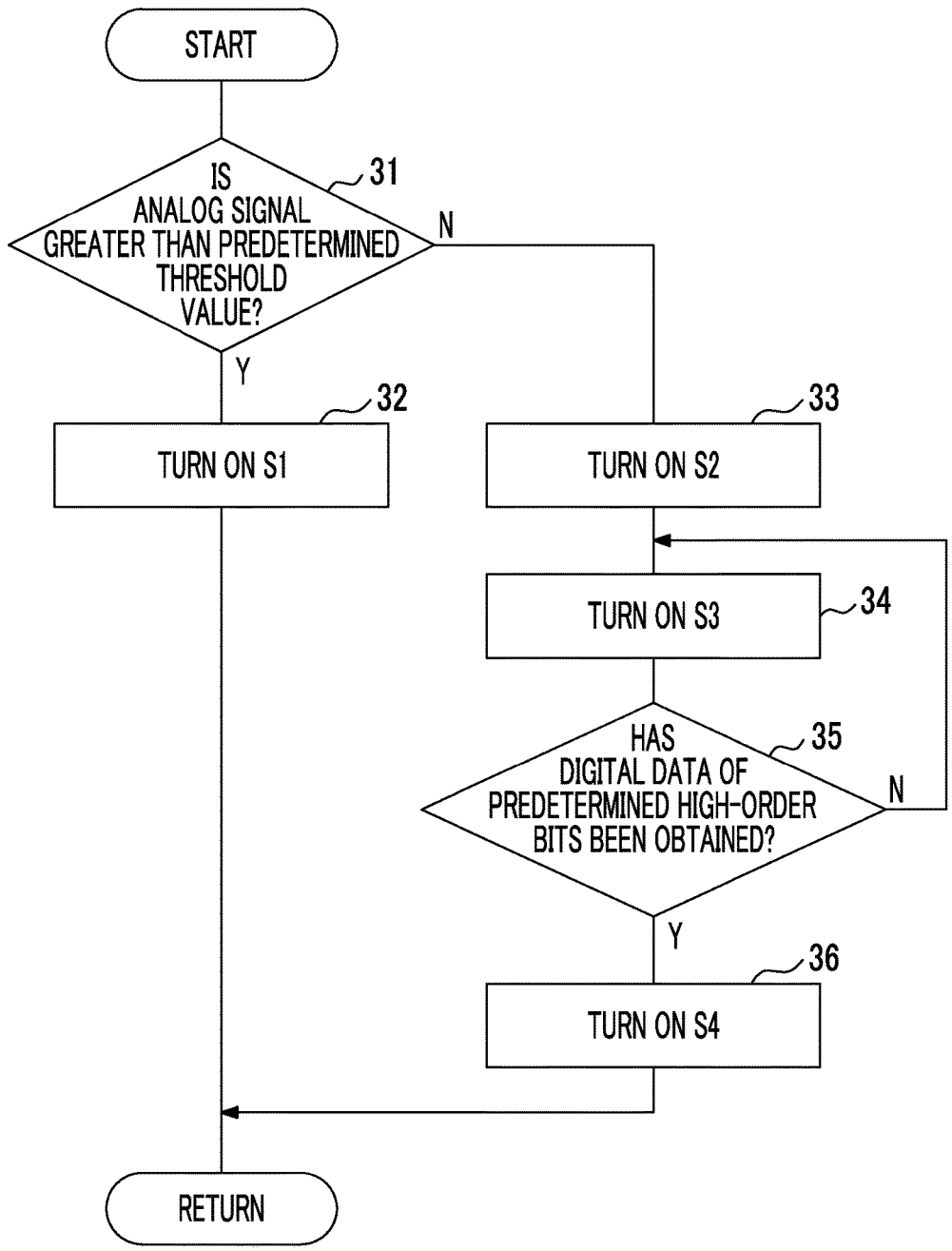
FIG. 5 is a flowchart showing a processing procedure of an analog/digital conversion device.

FIG. 5 is a flowchart showing a processing procedure of the analog/digital conversion device 10.

The control device 2 determines whether or not a level of the analog signal Vsig input to the analog/digital conversion device 10 is higher than a predetermined threshold value (step 31). A determination may be made as to whether or not the level of the analog signal Vsig is higher than the predetermined threshold value, on the basis of whether or not the average level of the analog signal Vsig is higher than a predetermined threshold value or may be made on the basis of whether or not a minimum level or a maximum level of the analog signal Vsig is higher than a predetermined threshold value. In a case where an image represented by the analog signal Vsig is divided into a plurality of blocks, a determination may be made as to whether or not the level of the analog signal Vsig is higher than the predetermined threshold value, on the basis of all or at least one of average values calculated for each block is greater than a predetermined threshold value. The predetermined threshold value may be an average value of a minimum value and a maximum value that can be taken by the analog signal Vsig, or may be an average value of the analog signal Vsig obtained by, for example, imaging in early morning, daytime, or nighttime, or the like, imaging in different weather such as fine weather, cloudy weather, or rainy weather, or the like. However, an average value of the analog signal Vsig obtained in a case where imaging of a relatively dark subject such as imaging at night, imaging in cloudy weather, or imaging in rainy weather is performed may be used, or the average value may not be used.

In a case where the level of the analog signal Vsig is higher than the predetermined threshold value (YES in step 31), the output terminal S1 of the first changeover switch 15 is turned on by the control device 2 (step 32). In a case where the analog signal Vsig to be converted into the digital data is greater than the threshold value, the analog signal Vsig is given to the single slope type analog/digital conversion circuit 11 (first analog/digital conversion circuit) by the first changeover switch 15. In a case where the level of the analog signal Vsig is equal to or lower than the predetermined threshold value (lower than the predetermined threshold value) (NO in step 31), the output terminal S2 of the first changeover switch 15 is turned on by the control device 2 (step 33). In a case where the analog signal Vsig to be converted into digital data is equal to or smaller than the predetermined threshold value (smaller than the predetermined threshold value), the analog signal Vsig is given to the hybrid type analog/digital conversion circuit 12 (second analog/digital conversion circuit) by the first changeover switch 15 (a first switching device). The precision of the analog/digital conversion is higher in the single slope type analog/digital conversion circuit 11 than in the hybrid type analog/digital conversion circuit 12. The analog/digital conversion is performed on the analog signal Vsig greater than the threshold value in the single slope type analog/digital conversion circuit 11 with high precision. The digital data with high precision can be obtained. The analog/digital conversion is performed on the analog signal Vsig equal to or smaller than the threshold value (smaller than the threshold value) in the hybrid type analog/digital conversion circuit 12 in which a time taken for the analog/digital conversion is shorter than that in the single slope type analog/digital conversion circuit 11. It is possible to perform analog/digital conversion in a relatively short time. In addition, in the hybrid type analog/digital conversion circuit 12, since analog/digital conversion precision with respect to the analog signal Vsig greater than the threshold value is not too lower than analog/digital conversion precision with respect to the analog signal Vsig smaller than the threshold value, relatively high precision digital data can be obtained.

In a case where the output terminal S2 of the first changeover switch 15 is turned on, the output terminal S3 of the second changeover switch 16 included in the hybrid type analog/digital conversion circuit 12 is turned on by the control device 2 (step 34). The analog signal Vsig is given to the successive approximation type analog/digital conversion circuit 13 (the third analog/digital conversion circuit). In the successive approximation type analog/digital conversion circuit 13, in a case where digital data of predetermined high-order bits (for example, 3 bits including the most significant bit) is obtained (step 35), an output terminal S4 of the second changeover switch 16 is turned on by the control device 2 (step 36). The analog signal Vsig is given to the successive approximation type analog/digital conversion circuit 13, and then, is given to the single slope type analog/digital conversion circuit 14 (fourth analog/digital conversion circuit) having precision of conversion into digital data lower than that of the successive approximation type analog/digital conversion circuit 13 by the second changeover switch 16 (a second switching device). Thus, switching is performed between the successive approximation type analog/digital conversion circuit 13 and the single slope type analog/digital conversion circuit 14 included in the hybrid type analog/digital conversion circuit 12 by the second changeover switch 16, and the analog signal Vsig is given to the successive approximation type analog/digital conversion circuit 13, and then, is given to the single slope type analog/digital conversion circuit 14.

The digital data output from the analog/digital conversion device 10 is gamma-corrected in the gamma correction circuit 21, as described above.

Figure 6:
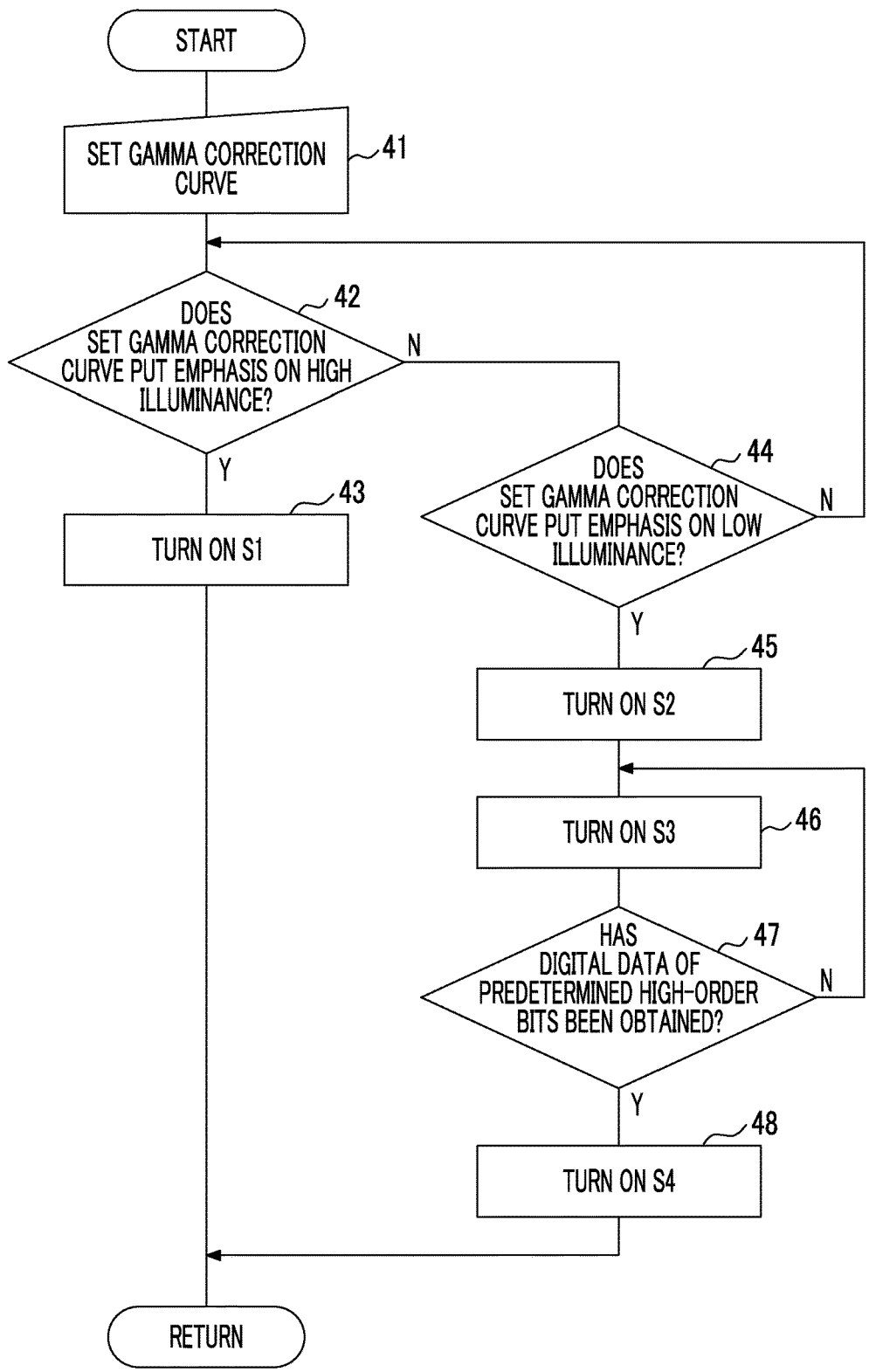
FIG. 6 is a flowchart showing another processing procedure of the analog/digital conversion device.

FIG. 6 illustrates another embodiment and is a flowchart showing the processing procedure of the analog/digital conversion device 10.

The user sets the gamma correction curve of the gamma correction circuit 21 using the gamma correction curve setting switch 3 (step 41). Whether the set gamma correction curve puts emphasis on high illuminance or low illuminance is determined by the control device 2 (steps 42 and 44). Whether the gamma correction curve is a gamma correction curve putting emphasis on high illuminance or a gamma correction curve putting emphasis on low illuminance is determined for each gamma correction curve in advance. The gamma correction curve putting emphasis on high illuminance (high level emphasis) refers to a gamma correction curve in which a compression rate of data after gamma correction of input data with high illuminance (high level) is small. Further, the gamma correction curve putting emphasis on low illuminance (low level emphasis) refers to a gamma correction curve in which a compression rate of data after gamma correction of input data with low illuminance (low level) is small. Whether a compression rate of the data after gamma-correction of input data with high illuminance (high level) or low illuminance (low level) is low or high to some extent is determined according to a subject that is a target, an imaging situation, and like. Further, in a case where there are a plurality of gamma correction curves, it will be determined whether the gamma correction curve is the gamma correction curve putting emphasis on high illuminance or the gamma correction curve putting emphasis on low illuminance. For example, in a case where the compression rate of the data after the gamma correction of the input data with a high illuminance (high level) in the first gamma correction curve is lower than in the second gamma correction curve, the first gamma correction curve is a gamma correction curve putting emphasis on the high illuminance. In a case where the compression rate of the data after the gamma correction of the input data with a low illuminance (low level) in the second gamma correction curve is lower than in the first gamma correction curve, the second gamma correction curve is a gamma correction curve putting emphasis on the low illuminance. Furthermore, the low illuminance or the high illuminance is relatively determined.

Figure 7:
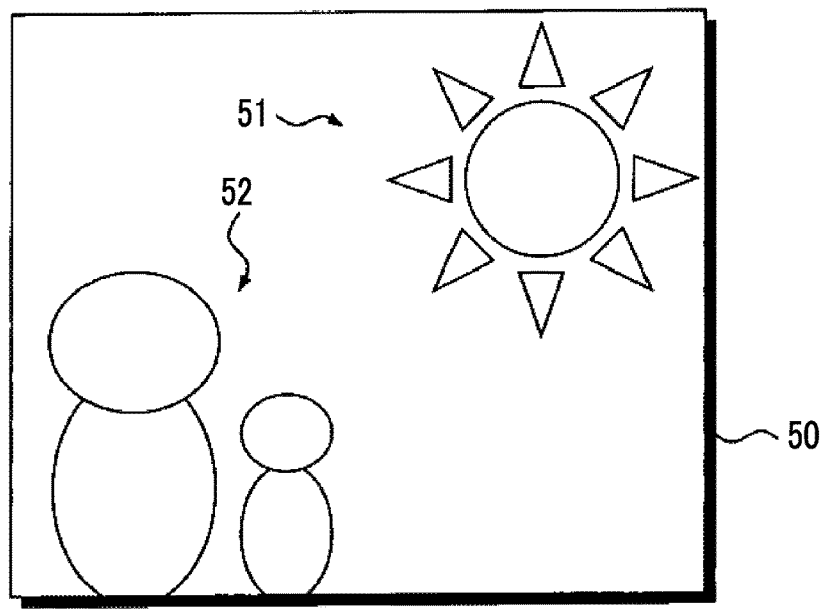
FIG. 7 illustrates an example of a high illuminance emphasized image.
Figure 8:
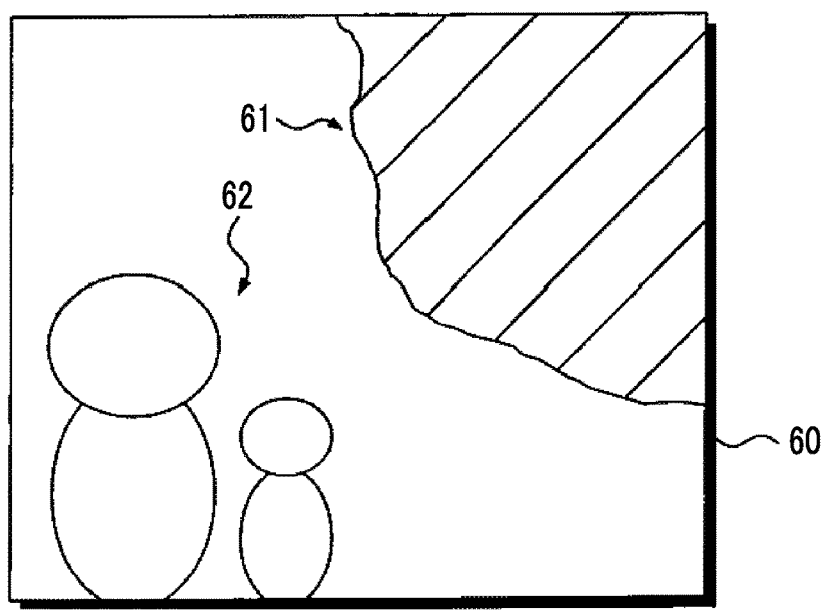
FIG. 8 illustrates an example of a low illuminance emphasized image.

FIG. 7 illustrates an example of a high illuminance emphasized image 50. FIG. 8 illustrates an example of a low illuminance emphasized image 60. The high illuminance emphasized image 50 illustrated in FIG. 7 and the low illuminance emphasized image 60 illustrated in FIG. 8 are both obtained in the same imaging scene.

The high illuminance emphasized image 50 illustrated in FIG. 7 includes an image 51 of the sun and an image 52 of persons. In the high illuminance emphasized image 50, a portion with high illuminance (high brightness) has a gradation that does not collapse.

The low illuminance emphasized image 60 illustrated in FIG. 8 includes a portion 61 (hatched) collapsing due to high brightness and an image 62 of persons. The collapsing portion 61 corresponds to the image 51 of the sun appearing in the high illuminance emphasized image 50 illustrated in FIG. 7. In the low illuminance emphasized image, the high illuminance portion may collapse since the low illuminance emphasized image does not put emphasis on the high illuminance portion.

Generally, the gamma correction curve putting emphasis on high illuminance is set in a case where a bright subject is imaged, and the gamma correction curve putting emphasis on low illuminance is set in a case where a dark subject is imaged.

Referring back to FIG. 6, in a case where the gamma correction curve set in the gamma correction circuit 21 by the user puts emphasis on the high illuminance (YES in step 42), this case is a case where the analog signal Vsig represents an image with high illuminance, and the output terminal S1 of the first changeover switch 15 is turned on (step 43). The analog signal Vsig is given to the single slope type analog/digital conversion circuit 11 by the first changeover switch 15. The single slope type analog/digital conversion circuit 11 can perform analog/digital conversion with high precision as compared with the hybrid type analog/digital conversion circuit 12.

In a case where the gamma correction curve set in the gamma correction circuit 21 by the user puts emphasis on the low illuminance (does not put emphasis on the high illuminance) (NO in step 42 and YES in step 44), this case is a case where the analog signal Vsig represents an image with low illuminance, and the output terminal S2 of the first changeover switch 15 is turned on (step 45). The analog signal Vsig is given to the hybrid type analog/digital conversion circuit 12 by the first changeover switch 15. In the hybrid type analog/digital conversion circuit 12, precision of the analog/digital conversion of the analog signal Vsig with the low illuminance is higher than the precision of the analog/digital conversion of the analog signal Vsig with high illuminance, such that the digital data can be obtained with relatively high precision. In addition, since a time taken for the analog/digital conversion is short, digital data can be obtained rapidly.

In a case where the output terminal S2 of the first changeover switch 15 is turned on, the output terminal S3 of the second changeover switch 16 included in the hybrid type analog/digital conversion circuit 12 is turned on (step 46). The analog/digital conversion of the analog signal Vsig is performed on predetermined high-order bits in the successive approximation type analog/digital conversion circuit 13. In a case where a predetermined digital data of high-order bits is obtained for the analog signal Vsig input to the successive approximation type analog/digital conversion circuit 13 (YES in step 47), the output terminal S4 of the second changeover switch 16 is turned on (step 47). The analog/digital conversion of the analog signal Vsig is performed in the single slope type analog/digital conversion circuit 14. High-precision analog/digital conversion is performed on the analog signal Vsig with low illuminance since bits (low-order bits) other than the predetermined high-order bits represent low illuminance (low level).

An analog/digital conversion circuit to be used for analog/digital conversion is selected according to the set gamma correction curve.

FIGS. 9 to 13 show still another embodiment.

Figure 9:
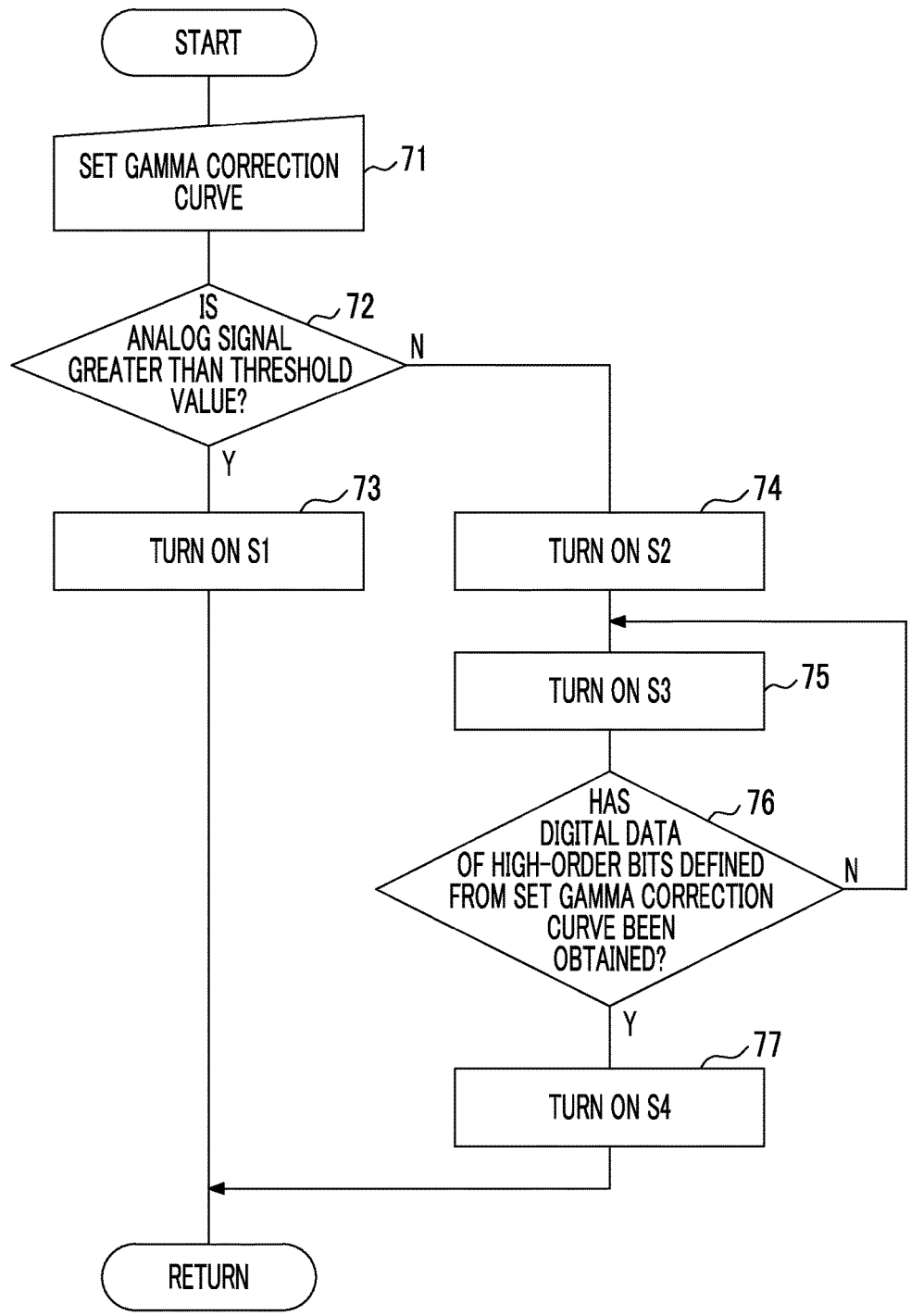
FIG. 9 is a flowchart showing still another processing procedure of the analog/digital conversion device.

FIG. 9 is a flowchart showing a processing procedure of the analog/digital conversion device 10.

As in the process illustrated in FIG. 6, a gamma correction curve to be used in the gamma correction circuit 21 is set by the user (step 71).

The control device 2 determines whether or not the analog signal Vsig output from the imaging element 6 is greater than a predetermined threshold value (step 72).

In a case where the analog signal Vsig is greater than the predetermined threshold value (YES in step 72), the output terminal 51 of the first changeover switch 15 is turned on (step 73). The analog signal Vsig is subjected to analog/digital conversion in the single slope type analog/digital conversion circuit 11.

In a case where the analog signal Vsig is equal to or smaller than the predetermined threshold value (smaller than the threshold value) (NO in step 72), the output terminal S2 of the first changeover switch 15 is turned on (step 74). The analog signal Vsig is subjected to analog/digital conversion in the hybrid type analog/digital conversion circuit 12. In the second changeover switch 16 included in the hybrid type analog/digital conversion circuit 12, the output terminal S3 is turned on, and the analog signal is given to the successive approximation type analog/digital conversion circuit 13. By the analog/digital conversion being performed in the successive approximation type analog/digital conversion circuit 13, it is determined in the control device 2 whether or not digital data of a high-order bit defined from the gamma correction curve set by the user has been obtained (step 76).

Figure 10:
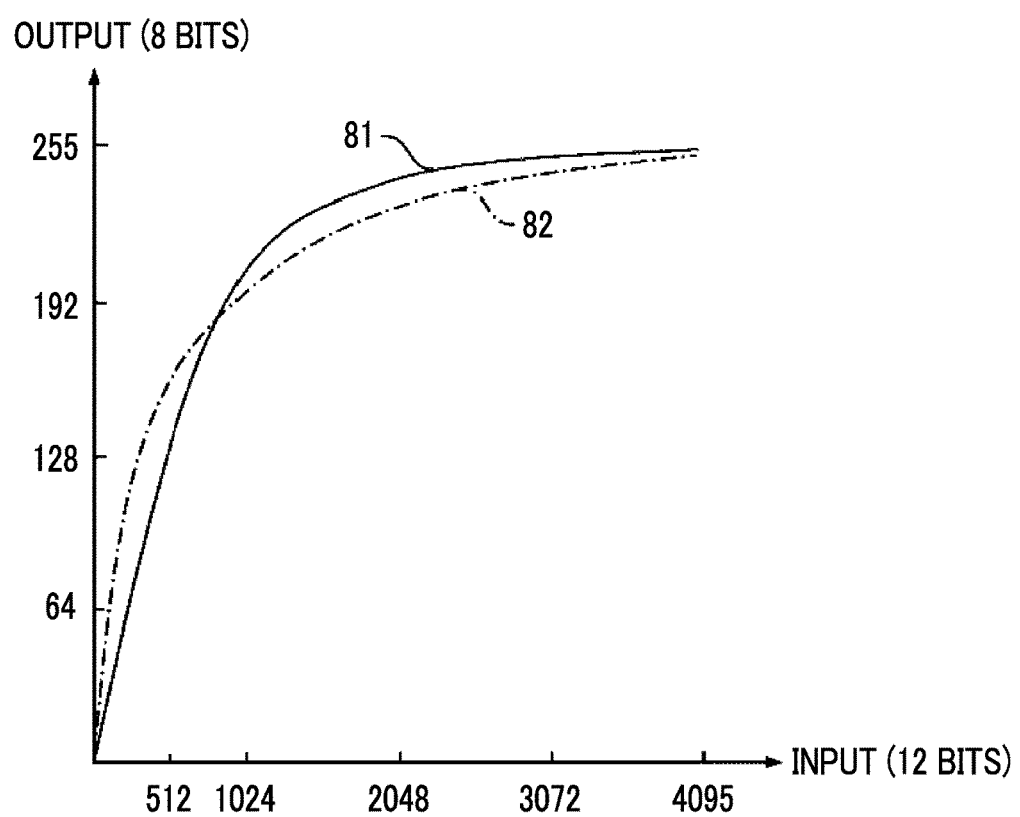
FIG. 10 illustrates an example of a gamma correction curve.

FIG. 10 illustrates an example of gamma correction curves 81 and 82 that can be set in the gamma correction circuit 21. In FIG. 10, an input of the gamma correction circuit 21 is defined on a horizontal axis, and an output of the gamma correction circuit 21 is defined on a vertical axis.

In the gamma correction, input data is compressed and output. For example, in a case where the input data includes 12 bits, the input data is corrected to 8-bit data and the 8-bit data is output. Of course, the input data may be compressed at other rates. In the gamma correction curve 81, a compression rate of the data after gamma correction is lower in a relatively lower input level than in a relatively high input level, as compared with the gamma correction curve 82. This means that the gradation of the image for the low illuminance (low brightness) is high. The gamma correction curve 81 is selected in a case where the low illuminance emphasized image is obtained. On the other hand, in the gamma correction curve 82, a compression rate of the data after gamma correction is not high even in the relatively high input level, as compared with the gamma correction curve 81. This means that the gradation of the image for not only the low illuminance but also the high illuminance (high brightness) is maintained. The gamma correction curve 82 is selected in a case where the high illuminance emphasized image is obtained. The gamma correction curve 81 is a gamma correction curve putting emphasis on the low illuminance, and the gamma correction curve 82 is a gamma correction curve putting emphasis on the high illuminance.

In this embodiment, the number of high-order bits on which the analog/digital conversion is performed in the successive approximation type analog/digital conversion circuit 13 is changed according to whether the gamma correction curve set in the gamma correction circuit 21 by the user puts emphasis on the high illuminance or the low illuminance. This is means that a timing of switching from the successive approximation type analog/digital conversion circuit 13 to the single slope type analog/digital conversion circuit 14 in the hybrid type analog/digital conversion circuit 12 is changed according to whether the gamma correction curve set in the gamma correction circuit 21 by the user puts emphasis on high illuminance or low illuminance. As the gamma correction curve set in the gamma correction circuit 21 is the gamma correction curve putting emphasis on high illuminance, the number of high-order bits to be subjected to the analog/digital conversion in the successive approximation type analog/digital conversion circuit 13 becomes small, and as the gamma correction curve set in the gamma correction circuit 21 is the gamma correction curve putting emphasis on the low illuminance, the number of high-order bits to be subjected to the analog/digital conversion in the successive approximation type analog/digital conversion circuit 13 becomes large. Therefore, as the gamma correction curve set in the gamma correction circuit 21 is the gamma correction curve putting emphasis on the high illuminance rather than the gamma correction curve putting emphasis on the low illuminance, a timing of switching from the successive approximation type analog/digital conversion circuit 13 to the single slope type analog/digital conversion circuit 14 is earlier.

Figure 11:
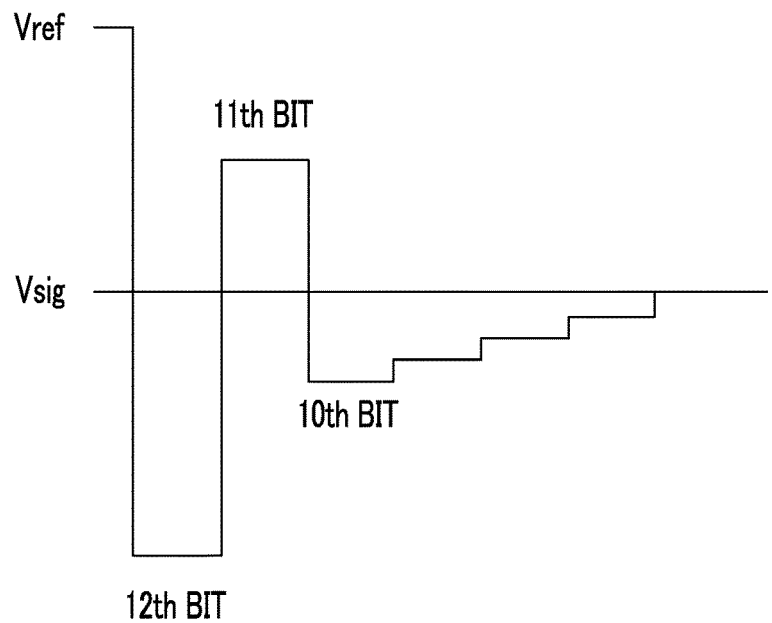
FIG. 11 illustrates another state of the analog/digital conversion of the hybrid type analog/digital conversion circuit.
Figure 12:
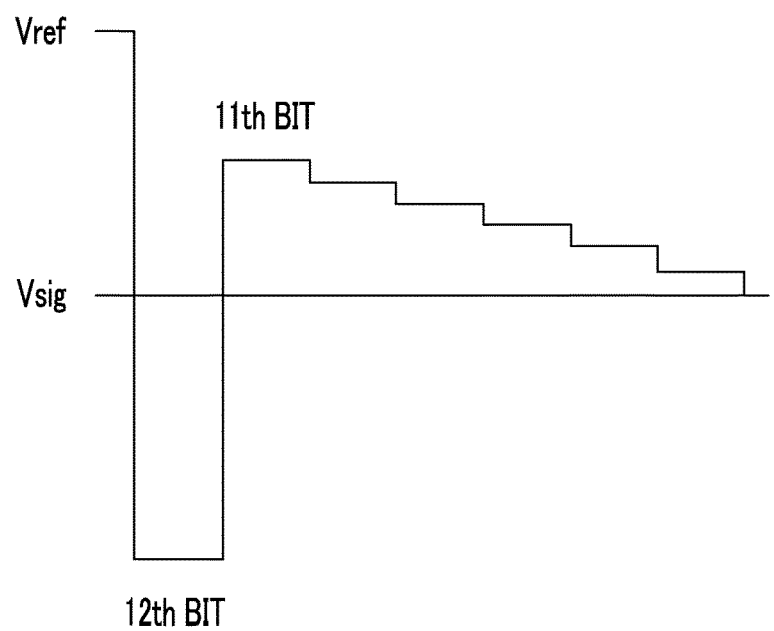
FIG. 12 illustrates still another state of the analog/digital conversion of the hybrid type analog/digital conversion circuit.

FIG. 11 illustrates a state of the analog/digital conversion in the hybrid type analog/digital conversion circuit 12 in a case where the gamma correction curve 81 putting emphasis on low illuminance has been set. FIG. 12 illustrates a state of the analog/digital conversion in the hybrid type analog/digital conversion circuit 12 in a case where the gamma correction curve 82 putting emphasis on high illuminance has been set.

Referring to FIG. 11, in a case where the gamma correction curve 81 putting emphasis on low illuminance has been set, control is performed by the control device 2 so that the analog/digital conversion is performed on the 3 high-order bits from the 10th bit to the 12th bit using the successive approximation type analog/digital conversion circuit 13, and the analog/digital conversion is performed on the remaining 9 low-order bits using the single slope type analog/digital conversion circuit 14.

On the other hand, referring to FIG. 12, in a case where the gamma correction curve 82 putting emphasis on the high illuminance is set, control is performed by the control device 2 so that the analog/digital conversion is performed on 2 high-order bits including the 11th bit and the 12th bit using the successive approximation type analog/digital conversion circuit 13, and the analog/digital conversion is performed on 10 other low-order bits using the single slope type analog/digital conversion circuit 14.

In a case where the gamma correction curve 81 with the low illuminance is set in the gamma correction circuit 21, the analog/digital conversion is performed on the digital data from the 12th bit to the 10th bit using the successive approximation type analog/digital conversion circuit 13, as illustrated in FIG. 11, whereas in a case where the high illuminance gamma correction curve 82 is set in the gamma correction circuit 21, the analog/digital conversion is performed on the digital data from the 12th bit to the 11th bit using the successive approximation type analog/digital conversion circuit 13, as illustrated in FIG. 12. In a case where the gamma correction curve 81 with a low illuminance is set in the gamma correction circuit 21, since the analog signal Vsig is subjected to the analog/digital conversion for the digital data from the 12th bit to the 10th bit representing a high illuminance portion using the successive approximation type analog/digital conversion circuit 13 with a short analog/digital conversion time, digital data can be obtained relatively rapidly. Since the analog/digital conversion is performed on the digital data from the 9th bit to the 1st bit representing a relatively low illuminance portion using the single slope type analog/digital conversion circuit 14, the digital data representing the low illuminance portion can be obtained with high precision. On the other hand, in a case where the high illuminance gamma correction curve 82 is set in the gamma correction circuit 21, since the analog/digital conversion is performed on the digital data of the 10th bit (also digital data from the 9th bit to the 1st bit) using the single slope type analog/digital conversion circuit 14, the digital data with high precision can be obtained. Since the analog/digital conversion is also performed on the digital data of the 10th bit in the single slope type analog/digital conversion circuit 14, the precision of the digital data of the 10th bit also becomes high. The digital data of the 10th bit is a value from 512 to 1024 as input data, and in a case where it is considered that the digital data represents a relatively high illuminance portion, the digital data with high precision can be obtained with respect to the input data 512 to 1024 representing a high illuminance portion.

In the above-described embodiment, in a case where the analog signal to be converted into the digital data is greater than the threshold value, the analog signal is given to the single slope type analog/digital conversion circuit 11, and in a case where the analog signal to be converted into the digital data is smaller than the threshold value, the analog signal is given to the hybrid type analog/digital conversion circuit 12, but the single slope type analog/digital conversion circuit 11 and the hybrid type analog/digital conversion circuit 12 may not be necessarily used. In a case where the analog signal to be converted into the digital data is greater than the threshold value, the analog/digital conversion is performed using the first analog/digital conversion circuit, and in a case where the analog signal to be converted into the digital data is smaller than the threshold value, the second analog/digital conversion circuit of which the precision of conversion of the analog signal greater than the threshold value into the digital data is lower than that of the first analog/digital conversion circuit may be used. For example, as the first analog/digital conversion circuit, a double integration type analog/digital conversion circuit can also be used instead of the single slope type analog/digital conversion circuit 11. Further, a double integration type analog/digital conversion circuit can also be used as the fourth analog/digital conversion circuit.

Further, the hybrid type analog/digital conversion circuit 12 includes the successive approximation type analog/digital conversion circuit 13 and the single slope type analog/digital conversion circuit 14. The same type of analog/digital conversion circuit is used for the single slope type analog/digital conversion circuit 11 to which the analog signal Vsig is given in a case where the output terminal S1 of the first changeover switch 15 is turned on, and the single slope type analog/digital conversion circuit 14 to which the analog signal Vsig is given in a case where the output terminal S2 of the first changeover switch 15 is turned on and the output terminal S4 is turned on, but it is not always necessary to use the same type of analog/digital conversion circuit. For example, the analog/digital conversion circuit to which the analog signal Vsig is given in a case where the output terminal S1 of the first changeover switch 15 is turned on may be the single slope type analog/digital conversion circuit 11 and the analog/digital conversion circuit to which the analog signal Vsig is given in a case where the output terminal S2 of the first changeover switch 15 is turned on and the output terminal S2 of the second changeover switch 16 is turned on may be a double integration type analog/digital conversion circuit.

Further, although the hybrid type analog/digital conversion circuit 12 includes the successive approximation type analog/digital conversion circuit 13 and the single slope type analog/digital conversion circuit 14, it is not always necessary to use the successive approximation type analog/digital conversion circuit 13 and the single slope type analog/digital conversion circuit 14. In a case where the output terminal S2 of the first changeover switch 15 is turned on, the analog signal Vsig is given to the third analog/digital conversion circuit in a case where the output terminal S3 of the second changeover switch 16 is turned on, and then, the analog signal Vsig is given to the fourth analog/digital conversion circuit having a higher precision of conversion of the input analog signal into the digital data than the precision of the conversion into digital data in the third analog/digital conversion circuit in a case where the output terminal S4 of the second changeover switch 16 is turned on.

What is claimed is:

1. An analog/digital conversion device comprising:
    a first analog/digital conversion circuit that converts an input analog signal into digital data;
    a second analog/digital conversion circuit of which precision of conversion of an analog signal greater than a threshold value into digital data is lower than precision of the first analog/digital conversion circuit; and
    a first switching device that gives the analog signal to the first analog/digital conversion circuit in a case where the analog signal to be converted into the digital data is greater than the threshold value, and gives the analog signal to the second analog/digital conversion circuit in a case where the analog signal to be converted into the digital data is smaller than the threshold value,
    wherein the second analog/digital conversion circuit includes
    a third analog/digital conversion circuit that converts an input analog signal into digital data,
    a fourth analog/digital conversion circuit of which precision of the conversion into digital data is higher than precision of the conversion into digital data in the third analog/digital conversion circuit, and
    a second switching device that switches between the third analog/digital conversion circuit and the fourth analog/digital conversion circuit to give the input analog signal to the third analog/digital conversion circuit and then give the input analog signal to the fourth analog/digital conversion circuit.

2. The analog/digital conversion device according to claim 1, wherein a time of conversion into the digital data in the first analog/digital conversion circuit is longer than a time of conversion into the digital data in the second analog/digital conversion circuit.

3. The analog/digital conversion device according to claim 1, further comprising:
    a gamma correction circuit that gamma-corrects the digital data converted by the first analog/digital conversion circuit or the second analog/digital conversion circuit according to the set gamma correction curve.

4. The analog/digital conversion device according to claim 3,
    wherein the first switching device
    gives the analog signal to the first analog/digital conversion circuit in a case where the gamma correction curve set in the gamma correction circuit puts emphasis on high illuminance, and
    gives the analog signal to the second analog/digital conversion circuit in a case where the gamma correction curve set in the gamma correction circuit puts emphasis on low illuminance.

5. The analog/digital conversion device according to claim 1, wherein in the second switching device, a timing of switching from the third analog/digital conversion circuit to the fourth analog/digital conversion circuit is earlier as the gamma correction curve is a gamma correction curve putting emphasis on high illuminance rather than a gamma correction curve putting emphasis on low illuminance.

6. The analog/digital conversion device according to claim 1, wherein the first analog/digital conversion circuit and the fourth analog/digital conversion circuit are single slope analog/digital conversion circuits or double integration type analog/digital conversion circuits.

7. The analog/digital conversion device according to claim 3,
    wherein the third analog/digital conversion circuit is a successive approximation type analog/digital conversion circuit, and
    the fourth analog/digital conversion circuit is a single slope analog/digital conversion circuit.

8. The analog/digital conversion device according to claim 1,
    wherein the second switching device that switches between the third analog/digital conversion circuit and the fourth analog/digital conversion circuit to give the input analog signal to the third analog/digital conversion circuit or give the input analog signal to the fourth analog/digital conversion circuit.

9. A method for controlling an analog/digital conversion device, the method comprising:
    converting an input analog signal into digital data by a first analog/digital conversion circuit;
    converting the input analog signal into the digital data by a second analog/digital conversion circuit of which precision of conversion of an analog signal greater than a threshold value into digital data is lower than precision of the first analog/digital conversion circuit; and
    giving, by a switching device device, the analog signal to the first analog/digital conversion circuit in a case where the analog signal to be converted into the digital data is greater than the threshold value, and giving the analog signal to the second analog/digital conversion circuit in a case where the analog signal to be converted into the digital data is smaller than the threshold value
    wherein the second analog/digital conversion circuit includes a third analog/digital conversion circuit that converts an input analog signal into digital data, and a fourth analog/digital conversion circuit of which precision of the conversion into digital data is higher than precision of the conversion into digital data in the third analog/digital conversion circuit,
    switching, by a second switching device, between the third analog/digital conversion circuit and the fourth analog/digital conversion circuit to give the input analog signal to the third analog/digital conversion circuit and then give the input analog signal to the fourth analog/digital conversion circuit.

* * * * *